(12) United States Patent
Finders et al.

(10) Patent No.: US 7,466,413 B2
(45) Date of Patent: Dec. 16, 2008

(54) MARKER STRUCTURE, MASK PATTERN, ALIGNMENT METHOD AND LITHOGRAPHIC METHOD AND APPARATUS

(75) Inventors: Jozef Maria Finders, Veldhoven (NL); Mircea Dusa, Campbell, CA (US); Richard Johannes Franciscus Van Haren, Waalre (NL); Luis Alberto Colina Santamaria Colina, Veldhoven (NL); Eric Henri Jan Hendrickx, Linden (BE); Geert Vandenberghe, Wijgmaal (BE); Alexander Hendrikus Martinus Van Der Hoff, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 537 days.

(21) Appl. No.: 10/887,323

(22) Filed: Jul. 9, 2004

(65) Prior Publication Data

US 2005/0031969 A1     Feb. 10, 2005

(30) Foreign Application Priority Data

Jul. 11, 2003    (EP)    ................... 03077203

(51) Int. Cl.
G01B 11/00    (2006.01)
(52) U.S. Cl. .................................................. 356/401
(58) Field of Classification Search .................. 356/401
See application file for complete search history.

(56) References Cited

U.S. PATENT DOCUMENTS 5,418,613 A    5/1995    Matsutani

| 6,165,656 | A | 12/2000 | Tomimatu |
| 6,301,001 | B1 | 10/2001 | Unno |
| 6,323,560 | B1 | 11/2001 | Narimatsu et al. |
| 6,982,793 | B1 * | 1/2006 | Yang et al. .................. 356/401 |
| 7,046,361 | B1 * | 5/2006 | Yang et al. .................. 356/401 |
| 7,175,945 | B2 * | 2/2007 | Mieher et al. .................. 430/5 |
| 7,177,457 | B2 * | 2/2007 | Adel et al. .................. 382/144 |
| 7,181,057 | B2 * | 2/2007 | Adel et al. .................. 382/144 |
| 2002/0093110 | A1 | 7/2002 | Fujimoto |

(Continued)

FOREIGN PATENT DOCUMENTS

EP    1 162 507 A2    12/2001

(Continued)

OTHER PUBLICATIONS

Translation of Japanese Office Action issued in Japanese Application No. 2004-202539 dated Jul. 10, 2007.

*Primary Examiner*—Patrick J Connolly
*Assistant Examiner*—Scott M Richey
(74) *Attorney, Agent, or Firm*—Pillsbury Winthrop Shaw Pittman LLP

(57) ABSTRACT

A mask pattern for imaging a marker structure on a substrate with a lithographic apparatus, the marker structure being configured to determine optical alignment or overlay, includes constituent parts to define the marker structure. The constituent parts include a plurality of segments, each segment having substantially a size of a device feature and a segment shape. The mask pattern includes at least one assist feature located at a critical part of the segment shape. The at least one assist feature has substantially a size below a resolution of the lithographic projection and is configured to counteract optical aberrations or optical limitations generated in the lithographic projection at the critical part.

3 Claims, 6 Drawing Sheets

U.S. PATENT DOCUMENTS

| | | |
|---|---|---|
| 2002/0118349 A1* | 8/2002 | Yang et al. .................... 355/55 |
| 2003/0026471 A1* | 2/2003 | Adel et al. .................. 382/144 |
| 2005/0195398 A1* | 9/2005 | Adel et al. .................. 356/401 |
| 2006/0204073 A1* | 9/2006 | Ghinovker et al. .......... 382/144 |

FOREIGN PATENT DOCUMENTS

| | | |
|---|---|---|
| EP | 1 260 869 A1 | 11/2002 |
| EP | 1 260 870 A1 | 11/2002 |
| GB | 2 358 714 A | 8/2001 |
| JP | 2001-22051 | 1/2001 |
| JP | 2003-7614 A | 1/2003 |

* cited by examiner

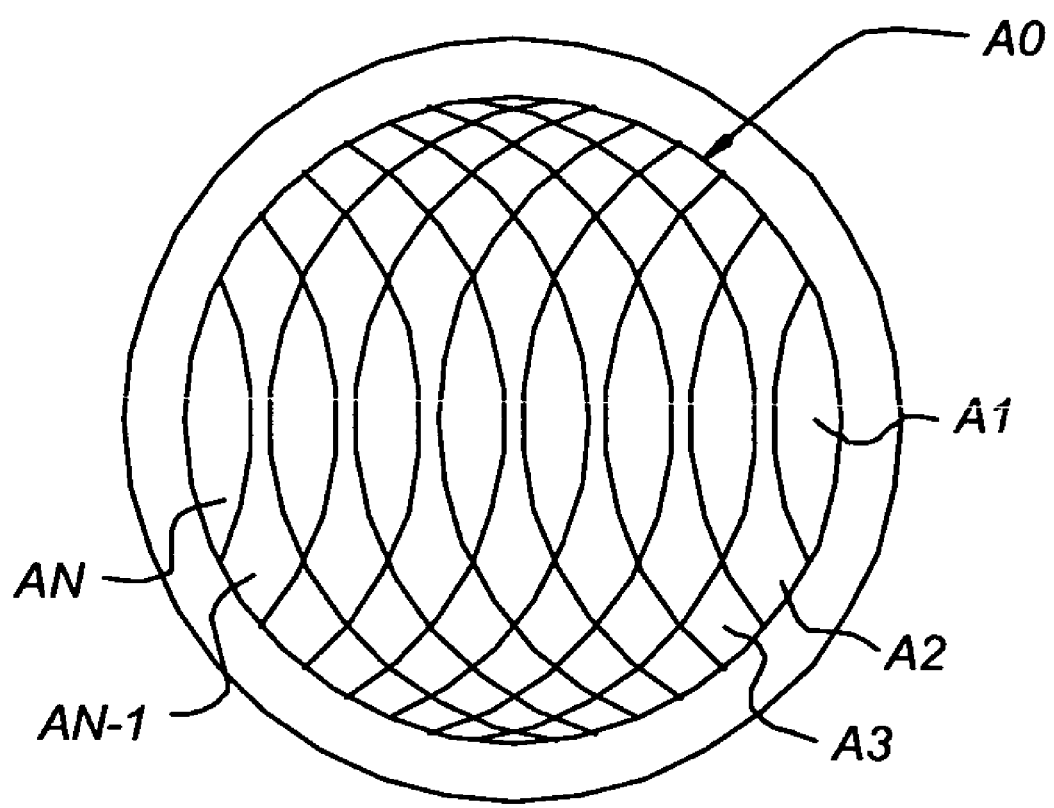

MARKER STRUCTURE, MASK PATTERN, ALIGNMENT METHOD AND LITHOGRAPHIC METHOD AND APPARATUS

RELATED APPLICATIONS

This application claims priority to European Patent Application No. 03077203.2, filed Jul. 11, 2003, herein incorporated by reference in its entirety.

FIELD OF THE INVENTION

The present invention relates to lithographic apparatus and methods.

BACKGROUND OF THE INVENTION

The term "patterning structure" as employed here should be broadly interpreted as referring to a structure that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmission mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a visco-elastic control layer and a reflective surface. The basic principle behind such an apparatus is that (for example) addressed areas of the reflective surface reflect incident light as diffracted light, whereas unaddressed areas reflect incident light as non-diffracted light. Using an appropriate filter, the non-diffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation devices. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described here above, the patterning structure can include one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the support structure may be embodied as a frame or table, for example, which may be fixed or movable as required; and A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as set forth here above.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. including one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper or step-and-repeat apparatus. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemical-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types configured to direct, shape or control the beam of radiation, and such components may also be referred to below, collectively or singularly, as a "lens".

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The person skilled in the art will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "projection beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm).

For a lithographic process, an alignment of the wafer to be processed with the mask pattern on the mask should be as precise as possible for a correct definition of features on the substrate, which features should have sizes within specified tolerances. To this end, the lithographic projection apparatus includes a wafer alignment module which provides for alignment of the substrate with the mask and mask pattern within a given (specified) tolerance. The wafer alignment system typically performs the alignment based on optical systems. The position of a wafer or a portion of a wafer is determined by measuring an optical response from an optical marker which is illuminated by an optical source: for example, a grating is illuminated by a laser beam, the laser beam diffracts from the grating, and one or more of the diffracted orders are measured by respective sensors, which are typically located on a reference plane. Using the output of the sensors, the position of the wafer can be derived (relative to the reference plane).

Optical markers for alignment typically include a grating with a periodicity suitable for diffraction of impinging light with a wavelength well within the visible range of the spectrum. An exemplary grating is constructed of lines and trenches with a typical periodicity of about 16 µm to obtain a usable diffraction pattern for a wavelength within the visible range of the spectrum. In order to obtain sufficient diffracted light from the grating and to obtain well-defined diffraction maxima and minima, it is desirable that the grating encompass a minimal number of lines and intermediate trenches. The size in the direction of the periodic structure is typically about 750 µm for this type of grating.

The grating may be a phase grating or phase marker which takes into account a phase difference between the phase of rays scattered at the upper surface of the grating and the phase of rays scattered at the lower surface of the grating.

Also, the grating may be an amplitude grating which only takes into account the periodic structure of the grating without any further phase difference relating to an upper or lower level in the grating. Typically, an amplitude grating or amplitude marker is constructed of a periodic structure of first and second elements, which have similar surface levels but different respective reflectance.

Optical markers may be used during microelectronic device processing (or IC processing) along the full manufacturing line. During the front end of line (FEOL), markers are typically used for alignment during manufacturing of transistor structures. At a later stage during the back end of line (BEOL), markers may be needed for alignment of metallization structures, e.g. connect lines, and vias. It is noted that in both cases, it is desirable that the integrity of the markers be sufficient to meet the required accuracy of alignment.

Further marker structures for overlay control may be present in one or more areas of a substrate to allow for controlling the overlay of a mask pattern in a resist layer (after exposure and development) with further pattern already present on the substrate. One structure for overlay control is the so-called metrology overlay target (of a box-in-box or bar-in-bar structure), which includes a first structure consisting of 4 rectangular blocks as constituent parts arranged with their length along one of the sides of an imaginary square, and a second structure similar to, but smaller than, the first structure. To determine the overlay of patterns in two successive layers, one of the first and second structures is defined in the pattern in the first layer, the other one of the first and second structures is defined in the pattern in the resist layer for the second successive layer. In use, for both first and second structure the position (i.e., the center of gravity) is determined by a detection of the edges of the respective rectangular blocks within the first and second structures. From the difference in position of center of gravity of the respective first and second structure, the overlay of the two structures is determined.

SUMMARY

A mask pattern according to an embodiment of the invention includes constituent parts to define a marker structure, each of the constituent parts including a plurality of segments, and each of the plurality of segments having substantially a size of a device feature and a segment shape, wherein the segments are arranged is in a direction substantially perpendicular to a scanning direction of the lithographic projection.

A mask pattern according to another embodiment includes constituent parts to define the marker structure, each of the constituent parts including a plurality of segments, and each of the plurality of segments having substantially a size of a device feature and a segment shape. The mask pattern for the marker structure comprises at least one assist feature located at a critical part of the segment shape, the at least one assist feature being configured to counteract optical aberrations or optical limitations generated by the lithographic apparatus at the critical part, and the at least one assist feature having substantially a size below a resolution of the lithographic apparatus.

In another embodiment, there is provided a mask pattern for imaging a marker structure on a substrate with a lithographic apparatus, the marker structure being configured to determine optical alignment or overlay, the mask pattern including constituent parts to define the marker structure, the constituent parts including a plurality of segments, each of the plurality of segments having substantially a size of a device feature and a segment shape; and isolated elements, wherein the isolated elements are configured such that a beam of radiation patterned by the mask pattern substantially fills an aperture of a projection system of the lithographic apparatus.

According to yet another embodiment of the invention, a lithographic projection apparatus allows application of the marker structure as described above.

Another embodiment of the invention includes a method providing a marker structure for optical alignment or overlay in a lithographic projection apparatus which is defined by a mask pattern as described above.

In yet another embodiment of the invention, there is provided a method for determining an overlay of a first layer of material relative to a second layer of material exposed by a lithographic apparatus, the first and the second layer of material including respectively a first and a second overlay structure, the method including determining a position of a center of gravity of the first and the second overlay structure; and calculating a difference of position between the center of gravity of the first and the second overlay structure, wherein each of the first and the second overlay structure is segmented into a plurality of segments in a direction substantially perpendicular to a scanning direction of the lithographic apparatus.

BRIEF DESCRIPTION OF THE DRAWINGS

Below, embodiments of the invention will be explained with reference to some drawings, which are intended for illustration purposes only and not to limit the scope of protection as defined in the accompanying claims.

FIG. 11 shows a pupil plane filling for a marker structure for overlay or alignment in accordance with an embodiment of the present invention.

DETAILED DESCRIPTION

Figure 1:
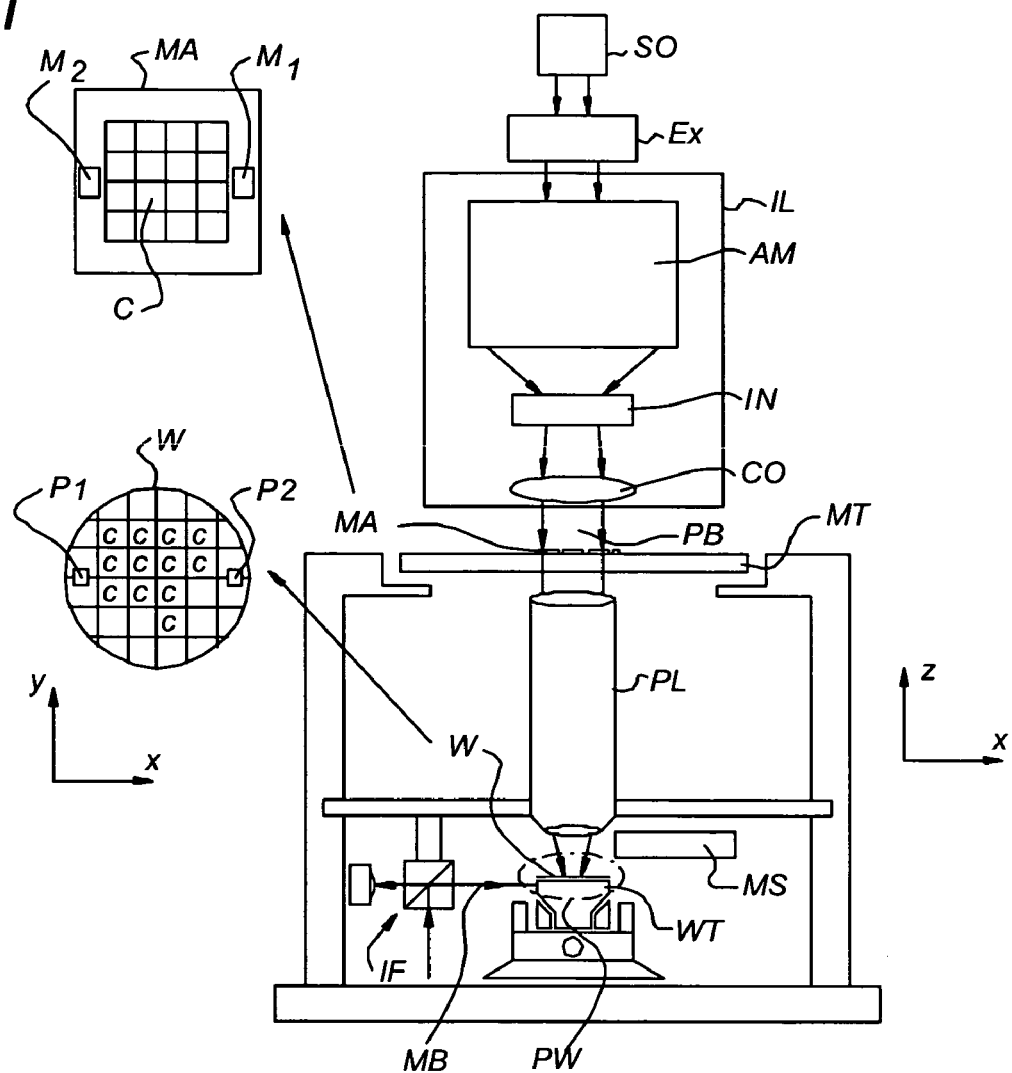
FIG. 1 depicts a lithographic projection apparatus including at least one marker structure in accordance with an embodiment of the present invention.

For proper processing, the constituent parts of a marker structure, which typically consists of the same material as (parts of) device features, should preferably have dimensions similar to dimensions of features of microelectronic devices. In that way, size-induced deviations may be avoided during processing of integrated circuits, due to, for example, a micro-loading effect during a reactive ion etching process, which may occur at device structures in the vicinity of a large marker area or due to size dependency of chemical-mechanical polishing (CMP) of structures.

U.S. Pat. No. 5,917,205 discloses photolithographic alignment marks based on circuit pattern features. Alignment marker structures are mimicked by a plurality of sub-elements which are ordered in such a way that their envelope corresponds to the marker structure. Further, each sub-element has dimensions comparable to a critical feature size of a microelectronic device. Basically, the solution to marker size induced processing deviations is by "chopping up" a large marker into many small-sized sub-elements which resemble features of a device (or "product").

Although the processing deviations of the structures lessen and signal strength improves, it is noted that overlay and alignment of features depends also on the quality of the projection system. The projection system includes lenses which each may have aberrations. Such aberrations are typically small, but since the device features to be imaged are becoming smaller with each new device generation, the relative influence of the aberrations is also increasing with each new device generation.

Moreover, the distortion is dependent on the actual optical path of a light signal. The light signal passes through an opening in a mask pattern (relating to a given feature), and traverses the projection system before impinging on the (resist coated) substrate.

Due to the dependency on the actually traversed optical path and mask feature diffraction spectrum, the observed distortion of imaged features varies with the position of the features on the mask and feature type, which is generally known as pattern induced distortion.

Furthermore, the density of a pattern of small features also influences the amount of pattern induced distortion. The distortion caused by a dense part in the center of a mask pattern will differ from a distortion caused by a less dense part at the edge of the mask pattern. As a result, the distortion measured for an overlay structure, e.g., a box-in-box target at the outer periphery of a mask pattern will differ from the distortion within the center part of the mask pattern.

Typically, the center of the mask pattern will include the devices or products which are relevant to the semiconductor device manufacturer. Therefore, the overlay control may not be very effective, as the devices may have a distortion different from the distortion measured at the location of the overlay target or marker structure.

Embodiments of the invention include a mask pattern for imaging a marker structure which reduces the effects of lens aberrations and of limitations of optical projection in a lithographic process. An arrangement of segmentation in a pattern according to at least some embodiments may be applied to strongly reduce the pattern-induced displacement in the scanning direction and/or to improve overlay and/or alignment quality in this direction.

Embodiments of the present invention may find an application in the field of lithographic projection apparatus that encompasses a radiation system configured to supply a beam of radiation, a support structure configured to support a patterning structure, which serves to pattern the projection beam according to a desired pattern, a substrate table configured to hold a substrate; and a projection system configured to project the patterned beam onto a target portion of the substrate.

FIG. 1 schematically depicts a lithographic projection apparatus 1 including at least one marker structure according to an embodiment of the invention. The apparatus includes a radiation system Ex, IL, configured to supply a beam PB of radiation (e.g. UV radiation). In this particular case, the radiation system also includes a radiation source SO. The apparatus also includes a first object table (mask table) MT provided with a mask holder configured to hold a mask MA (e.g. a reticle), and connected to a first positioning device (not shown) configured to accurately position the mask with respect to the projection system ("lens"), item PL, and a second object table (substrate table) WT provided with a substrate holder configured to hold a substrate W (e.g. a resist-coated silicon wafer), and connected to second positioning device PW configured to accurately position the substrate with respect to item PL. The apparatus further includes a projection system ("lens") PL configured to image an irradiated portion of the mask MA onto a target portion C (e.g. including one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning structure, such as a programmable mirror array of a type as referred to above.

The source SO (e.g. a mercury lamp or an excimer laser) produces a beam of radiation. This beam is fed into an illumination system (illuminator) IL, either directly or after having traversed conditioning structures, such as a beam expander Ex, for example. The illuminator IL may include an adjusting structure AM configured to set the outer and/or inner radial extent (commonly referred to as σ-outer and σ-inner, respectively) of the intensity distribution in the beam. In addition, it will generally include various other components, such as an integrator IN and a condenser CO. In this way, the beam PB impinging on the mask MA has a desired uniformity and intensity distribution in its cross-section.

It should be noted with regard to FIG. 1 that the source SO may be within the housing of the lithographic projection apparatus (as is often the case when the source SO is a mercury lamp, for example), but that it may also be remote from the lithographic projection apparatus, the radiation beam which it produces being led into the apparatus (e.g. with the aid of suitable directing mirrors). This latter scenario is often the case when the source SO is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and an interferometric measuring device, the substrate table WT can be moved accurately, e.g. so as to position different target portions C in the path of the beam PB. Similarly, the first positioning device (acting on mask table MT) can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected at once (i.e. a single "flash") onto a target portion C. The substrate table WT is then shifted in the X and/or Y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the Y-direction) with a speed v, so that the projection beam PB is caused to scan over a mask image; concurrently, the substrate table WT is simultaneously moved in the same or opposite direction at a speed V=M v, in which M is the magnification of the lens PL (typically, M=¼ or ⅕). In this manner, a relatively large target portion C can be exposed, without having to compromise on resolution.

The interferometric measuring device can typically include a light source, such as a laser (not shown), and one or more interferometers configured to determine some information (e.g., position, alignment, etc.) regarding an object to be measured, such as a substrate or a stage. In FIG. 1, for example, one interferometer IF is schematically depicted. The light source (laser) produces a metrology beam MB which is routed to the interferometer IF by one or more beam manipulators. In case more than one interferometer is present, the metrology beam may be shared between them, by using optics that split the metrology beam in various separate beams for each interferometer.

A substrate alignment system MS configured to align a substrate on table WT with respect to a mask on mask table T, is schematically shown at an exemplary location close to table WT. The system MS includes at least one light source which generates a light beam aimed at a marker structure on the substrate and at least one sensor device which detects an optical signal from that marker structure. It is noted that the location of the substrate alignment system MS may depend on design conditions that vary with the actual type of lithographic projection apparatus.

Figure 2:
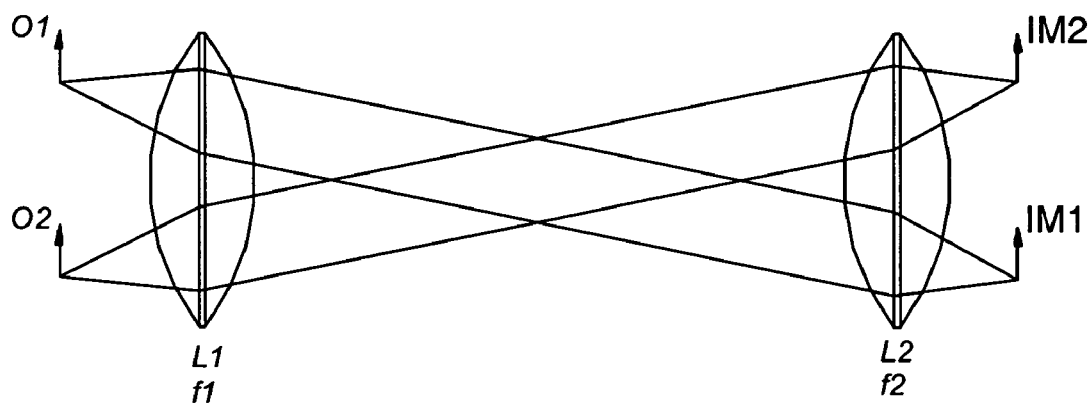
FIG. 2 shows schematically a projection system according to an embodiment of the invention.

FIG. 2 shows schematically a projection system PL for a lithographic projection apparatus as shown in FIG. 1.

The projection system can be schematically depicted as a telescope. Such a telescope includes at least two lenses: a first lens L1 with a first focus f1, and a second lens L2 with a second focus f2. In this exemplary telescope the first and second lens L1, L2 are convex lenses. Persons skilled in the art will appreciate that a projection system for a lithographic projection apparatus may include a plurality of convex and concave lenses.

In use, a first object O1 which is located in the object plane OFP is imaged as a first image IM1 on a reference plane RP. The first object O1 is a first geometrical pattern portion for forming a first feature on the substrate in the reference plane RP. The first feature typically is a micro-electronic device to be formed, such as a transistor, or a portion of such a device, such as a gate. Typically a transistor has a lateral size of submicron dimension. Accordingly, the first object has a lateral size in the mask pattern with a dimension magnified by the magnification factor M of the projection system.

Due to the (still) small finite size of the first object O1, a light beam passing the mask portion of the first object traverses only through a first limited portion of the aperture of the lenses of the projection system PL. This effect is indicated by the light paths extending from O1 towards the image IM1.

Likewise, a second object O2 is imaged as a second image IM2 on the substrate plane. In this example, the second object O2 has a size comparable to the size of the first object O1, traverses through only a second limited portion of the aperture of the lenses of projection system PL. However, due to the different location of second object in the mask pattern, the second limited portion of the projection system PL used for imaging the second object O2 is different from the first portion for imaging the first object. Since lens aberrations vary with the location on the lens, the image of first object O1 may suffer from a different pattern induced distortion than the image of the second object.

It will be appreciated that the separation between the first and second object on the mask pattern may influence the degree to which the suffered pattern-induced distortion is different for the first and second image. When the first and second objects are located at relatively close distance, the portion used of the projection system may be almost identical. At large distance, the distortion may be different (depending on local variation in the projection system) since the portions of the projection system used for creating the first and second image may differ.

Such a variation of distortion may disadvantageously occur for a first and second object within a single mask pattern. It may also occur as variation of distortion between a first and a second object which are imaged by different masks. In that case, the variation of distortion may add to the overlay error of the masks.

Figure 3:
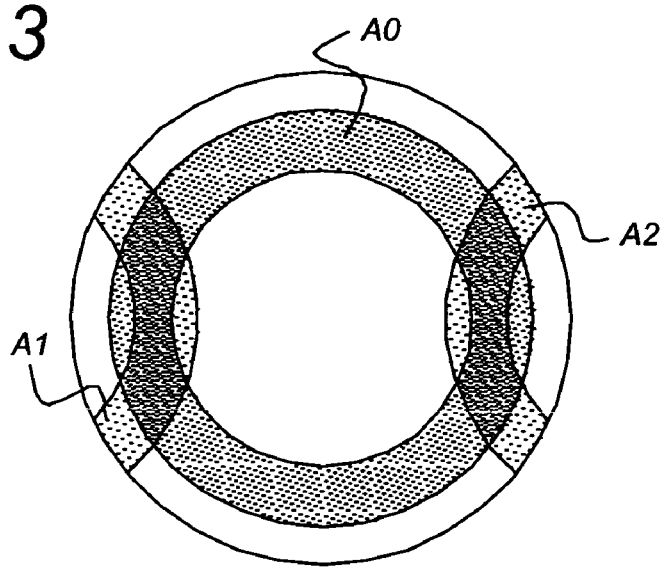
FIG. 3 shows an exemplary pupil plane filling.

FIG. 3 shows an exemplary intensity distribution in the pupil plane.

The illumination mode as displayed in the pupil plane of the projection system PL depends on the provided illumination, and also on the shape and size of the object that is being illuminated by the source SO.

In FIG. 3 the intensity distribution in the pupil plane is shown for an annular illumination passing through a densely packed array of about 100 nm spaces with a pitch of about 100 nm. The wavelength of the source SO may be any one usable as radiation beam e.g. as described above in the introductory part of the description.

Clearly, the annular shape is shown as a central annulus A0, which due to the diffraction on the densely packed array further includes two annular portions A1, A2. The relatively short repetition length within the array (200 nm) provides a relative large separation between the $0^{th}$ order diffraction maximum (i.e., A0) and the first order diffraction maxima (i.e., A1 and A2).

Segmentation of marker structures to mimic product-sized structures may affect the definition of such structures during the imaging step to produce an exposure on the substrate's surface. From product structures it is known that an exposure step may suffer from pattern induced distortion effects.

Figure 4:
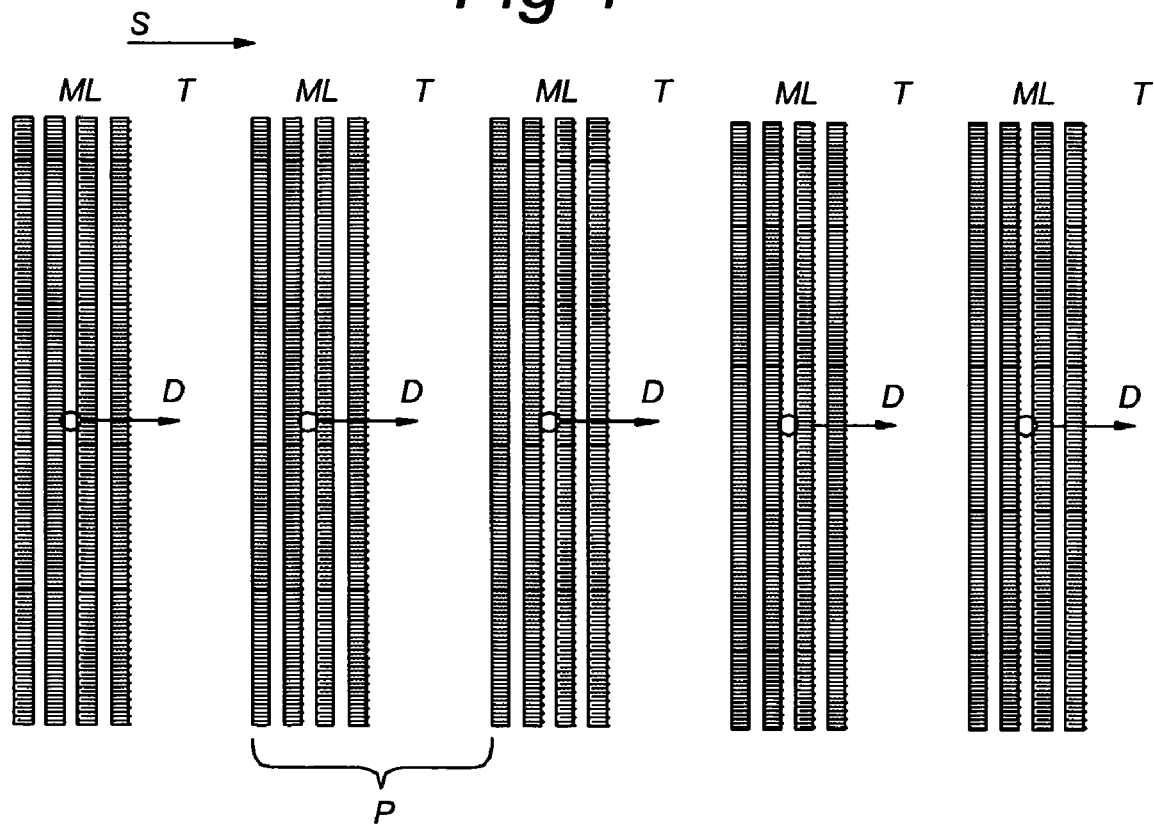
FIG. 4 schematically shows a pattern induced displacement for a structure including small-sized features.

These pattern induced distortion effects may slightly shift the centre position of the product-sized structure. Such a shift is shown in FIG. 4, which schematically shows pattern induced displacement for a structure including small-sized features.

The structure shown may be a segmented marker structure including segmented first structural elements ML and second structural elements T in between.

This segmented marker structure is exposed in a step-and-scan lithographic projection apparatus as described above. The scanning direction is indicated by the arrow S. The pattern induced displacement is schematically indicated in each segmented "marker line" by arrows D. The pattern induced displacement is directed parallel to the scanning direction. As is apparent to persons skilled in the art, the pattern induced displacement may disadvantageously affect any position related measurement such as alignment or overlay.

A first approach to minimize the influence of pattern induced displacement is by segmenting the marker lines in the structure in a direction perpendicular to the scanning direction S.

Figure 5:
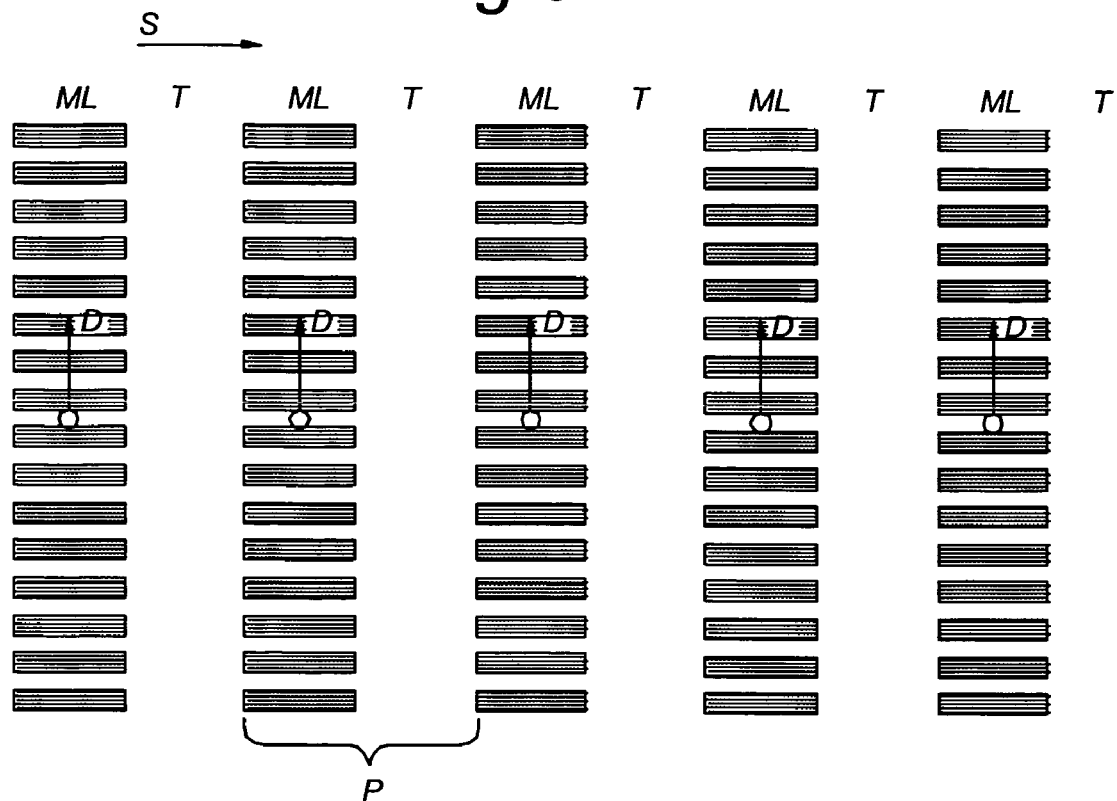
FIG. 5 shows a segmented marker structure with reduced sensitivity for pattern induced displacement.

FIG. 5 shows a segmented marker structure with reduced sensitivity for pattern induced displacement. In FIG. 5, the scanning direction of the lithographic projection indicated by arrow S is parallel to the periodicity of the marker structure. The pattern induced displacement (indicated by arrow D) is now directed perpendicular to the direction S, such that the alignment position is not affected by the pattern-induced displacement.

However, in the scanning direction a further displacement effect known as "asymmetric line shortening" may occur for features with relatively small size perpendicular to the scanning direction. Typically, asymmetric line shortening relates to exposure dose effects which are caused by relatively small-sized critical parts of a geometry of the desired shape, e.g., begin and end part of a line, or a corner of an area.

Figure 6:
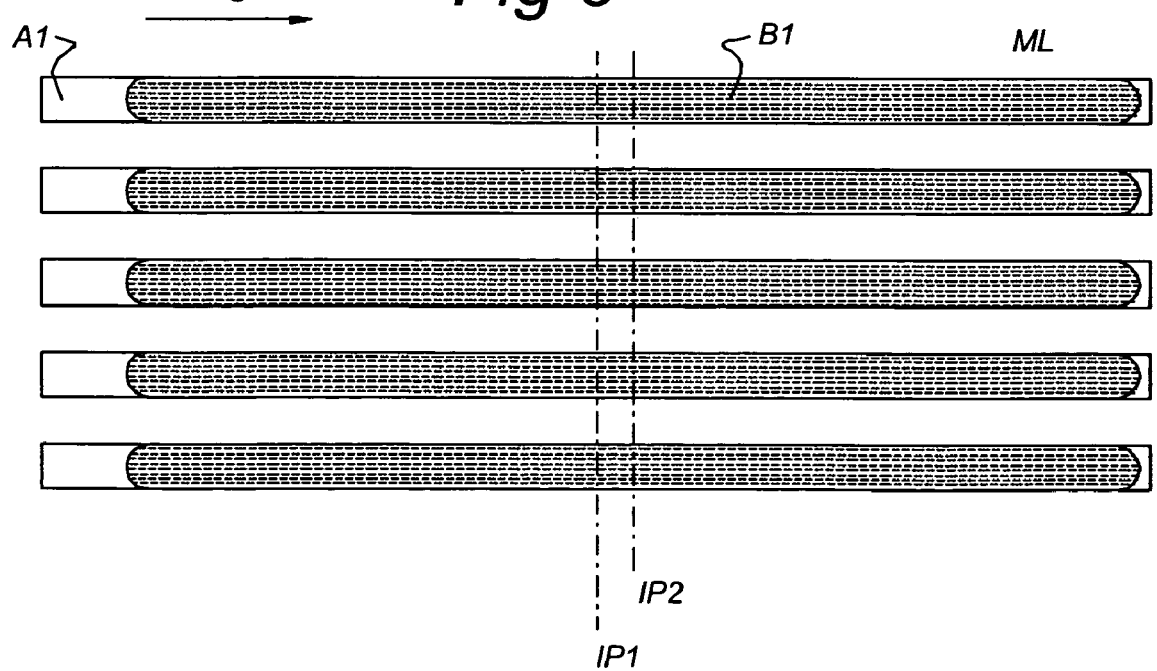
FIG. 6 schematically shows a change of line length by "asymmetric line shortening" for segmented line parts.

FIG. 6 schematically shows a change of line length by "asymmetric line shortening" for segmented line parts. The scanning direction is indicated by arrow S. The line parts extend parallel to S. The box-shaped area A1 indicates the desired shape for a line part. The rounded solid area B1 indicates the shape as defined by the exposure step. It is observed that the beginning of the line part is shifted by a relatively large amount with respect to the desired line shape. The end of the line part has shifted by a smaller amount relative to the desired line shape. The rounding is typically caused by aberrations of the projection lens system and limitations of the optical properties of the projection lens system.

In FIG. 6 an indication IP1 is shown for the expected centre position of the marker line (i.e., the middle of the desired line shape A1) and an indication IP2 for the measured centre position due to the asymmetric line shortening of the line part (i.e., the middle of the line part). As can be seen in FIG. 6, asymmetric line shortening may cause a shift of the centre position of a line shape relative to a desired position.

In one embodiment of the present invention, the segments of the marker structure are corrected by adapting the shape of the segments on the mask. By the adapted shape the dose effect can be corrected.

Figure 7:
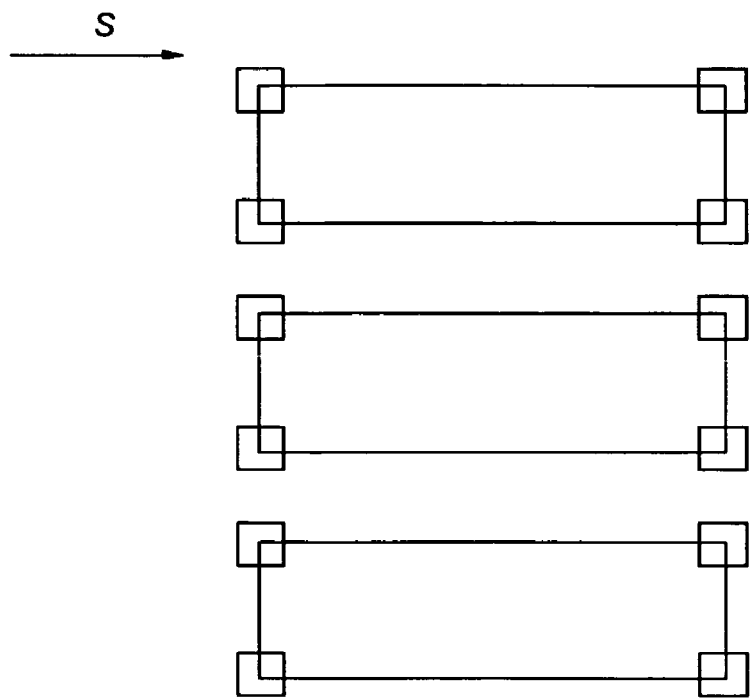
FIG. 7 schematically shows a first mask pattern configured to correct asymmetric line shortening effects for a marker structure in accordance with an embodiment of the present invention.
Figure 8:
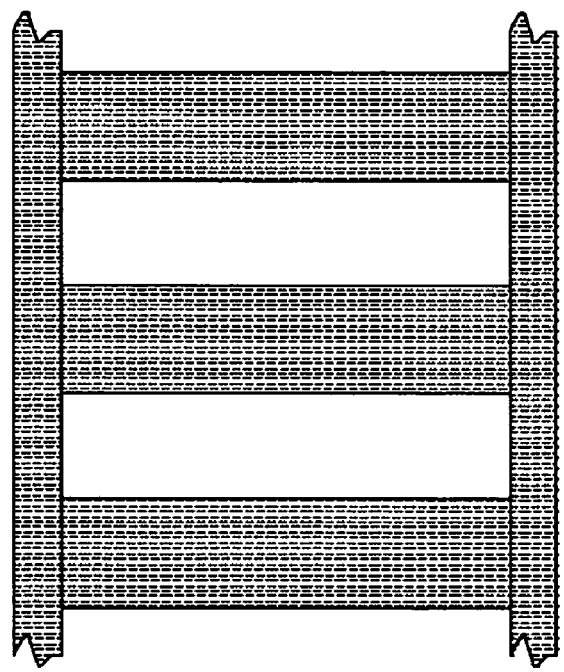
FIG. 8 schematically shows a second mask pattern configured to correct asymmetric line shortening effects for a marker structure in accordance with an embodiment of the present invention.

FIG. 7 schematically shows a first adapted shape on a mask configured to correct asymmetric line shortening effects in a marker, and FIG. 8 schematically shows a second adapted shape on a mask configured to correct asymmetric line shortening effected in a marker.

In FIG. 7 some segments are shown as defined on a mask for a marker line which include a first adapted form to correct for asymmetric line shortening. The segmented lines each include a basic rectangular shape which defines the segments according to the desired shape as shown in FIG. 5. To correct the asymmetric line shortening effects described above, critical parts of the desired shape (i.e., the corner parts) are defined by box-shaped assist parts, partially overlapping the corners of the desired shape. During exposure, the box-shaped assist parts allow for a correction of lens aberrations and/or limitations of the optical properties of the projection lens system.

In FIG. 8 some segments are shown as defined on a mask for a marker line which include a second adapted form to correct for asymmetric line shortening.

To correct pattern-induced effects as described above, critical parts of the desired shape (i.e., the corner parts) are defined by line-shaped assist parts, which connect adjacent segments. The line-shaped assist parts extend in a direction perpendicular to the desired scanning direction of the marker (to be formed).

It is noted that the box-shaped or line-shaped assist parts are only defined on the mask to augment the shape of the marker as exposed image. Due to their size, which is below the resolution of the lithographic process, the assist parts do not show in the marker image. The marker image only shows the desired shape of the segments with correction for asymmetric line shortening.

It is further noted that other shapes of assist parts can be used for rectification of a marker image into a desired shape. Also, the assist parts may be selected to have different shapes depending e.g. on their location within the mask pattern.

The assist feature may be used to create a correction for critical parts which otherwise may not be properly created on the surface layer, due to lens aberrations.

The assist features have dimensions below the resolution of the projection system in a lithographic projection apparatus and are not created as further structural elements in the lithographic process.

In an embodiment of the invention, there is provided a mask pattern which substantially has the same pattern induced distortion as a second mask pattern for device features of "product" (e.g. elements of components of an integrated circuit).

Figure 9:
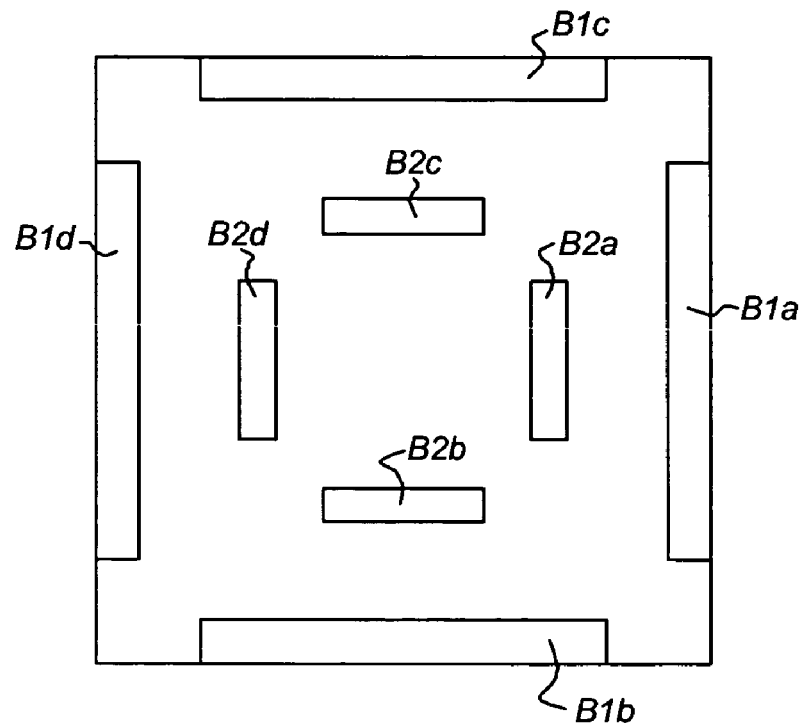
FIG. 9 shows a conventional marker structure for overlay control.

FIG. 9 shows a marker structure for overlay control. Typically, overlay control is determined by a marker structure known as box-in-box or bar-in-bar target. A box-in-box target includes a first overlay structure OS1 consisting of 4 rectangular blocks B1$a$, B1$b$, B1$c$, B1$d$, arranged with their length along one of the sides of an imaginary square, and a second overlay structure OS2 similar to, but smaller than, the first structure, also consisting of four rectangular blocks B2$a$, B2$b$, B2$c$, B2$d$. The first overlay structure OS1 is defined in a first layer on the substrate. Next, in a resist layer covering the first layer, the second overlay structure OS2 is defined during the exposure step of the mask pattern for that particular resist layer.

To determine the overlay of the first and second overlay structure, for both the first and the second structure the position (i.e., the center of gravity of the rectangular blocks) is determined by a detection of the position of the long edges of the respective rectangular blocks within the structure. From the difference in position of the center of gravity of the respective first and second structure, the overlay (i.e., the amount of mismatch) of the two structures may be determined.

It should be understood that the pattern induced distortion of the overlay structures OS1 and OS2 may differ from the distortion of product features, e.g. because of the size difference between overlay structure and product features. The larger overlay structures "employ" a larger portion of the projection system than do the product features. Thus, a mismatch determined by the overlay structures is likely not to correspond to the mismatch of product features in the two layers.

Figure 10:
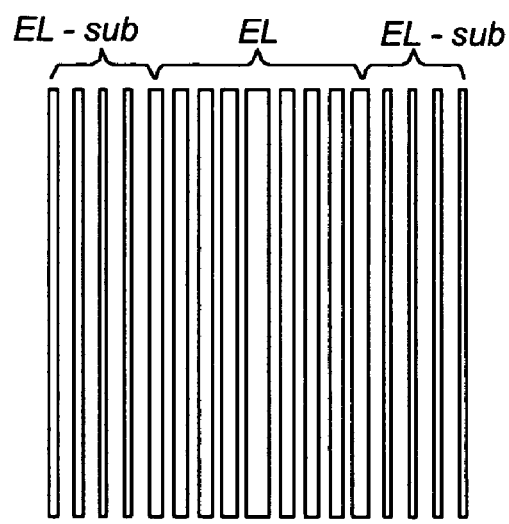
FIG. 10 shows a marker structure for overlay control to correct pattern induced displacement in accordance with an embodiment of the present invention.

In an embodiment of the invention, a mismatch which substantially corresponds to the mismatch of product features may be obtained by the overlay measurement. FIG. 10 shows a marker structure for overlay control to correct pattern induced displacement in accordance with an embodiment of the present invention.

According to this embodiment of the present invention, the pattern induced distortion of the metrology overlay target may be substantially similar to the pattern induced distortion for product features (with far smaller size). Such result may be achieved by using a target mask pattern of which pitch of features of the overlay structure resembles product feature pitch, but of which the image is projected in the image plane as a genuine metrology overlay target structure. The target mask pattern according to this embodiment is constructed of segmented elements EL, which have a sub-resolution size (i.e., they are not printable), but due to their pitch in a projection, they form the image of the metrology overlay target.

However, the edge of the image may have a different distortion than the centre of the structure due to the relative abundance of elements EL in the centre. Since the overlay measurement strongly depends on determining the position of the edges of overlay structures, still an additional error may be made relative to the distortion of imaged product features.

In an embodiment of the invention, the edges of the target mask pattern further include sub-resolution elements EL_sub, which as such are not imaged, but which by their presence can modify the imaging conditions at the imaged edges of the overlay structure, in such a way that the edges are imaged without the additional error mentioned above.

Due to the use of segmented elements EL with a pitch similar to product and the use of sub-resolution elements EL_sub, the pattern induced distortion at the edges of the overlay structure may substantially correspond to the pattern-induced distortion of product feature sizes: only a portion of the optical system is being used for pattern transfer in a similar way as for product features, as explained in more detail with reference to FIG. 2.

In the image plane, however, the elements EL and EL_sub are not imaged individually, and a resolved image is formed instead (in the resist layer). The outer edge positions of the resolved image now correspond to the outer edge positions of the conventional overlay target structure, but due to the different imaging conditions (relative to prior art overlay structures) the pattern induced distortion of the resolved image may be similar to the distortion of imaged product features. Thus, information obtained from the resolved image corresponds with the mismatch of product features.

The rectangular blocks B1$a$, B1$b$, B1$c$, B1$d$ of the first overlay structure and the four rectangular blocks B2$a$, B2$b$, B2$c$, B2$d$ of the second overlay structure OS2 may therefore be formed from a resolved image constructed either by a line pattern consisting of elements EL and sub-resolution elements EL_sub, wherein elements EL are arranged in a central portion of the pattern as indicated in FIG. 10 with sub-resolution elements EL_sub arranged on the outer edges of the pattern, or, by a line pattern consisting of only sub-resolution elements EL_sub.

With respect to system qualification, which is usually performed using alignment and overlay structures, pattern induced distortion may also occur. Conventional system qualification alignment and overlay structures are not designed to be insensitive to aberration effects. Consequently, the size and feature shape of alignment structures may influence the image displacement (pattern induced distortion) of the structures during lithographic projection. Thus, system qualification may suffer from an unquantified error due to pattern-induced distortion.

In a further embodiment of the invention, the influence of pattern induced distortion for a given system qualification mask pattern for an alignment structure or for an overlay structure may be minimized by employing substantially all of the optics of the projection system, instead of a limited portion of the optics of the projection system PL.

In order to do so, an alignment structure mask pattern may be constructed using features which are optically isolated. An isolated feature is a feature where the width of a feature element is of the order of the critical dimension (i.e. imaging resolution) of the lithographic projection apparatus, and where the pitch (i.e. the separation between adjacent feature elements) is of the order of 5 or more times the critical dimension.

When isolated features are illuminated by the beam of radiation PB, the diffraction that they cause may be sufficiently broad that substantially all of the optics of the projection system PL are used (i.e. the aperture of the projection system is filled). This is shown schematically in FIG. 11, which is a schematic view of the pupil plane of the projection system. A mask (not shown) having isolated features is illuminated by a conventional disc shaped mode. The isolated features generate a plurality of high order diffraction beams. The projections of the high order diffraction beams in the pupil plane A1, A2, A3 . . . AN−1, AN are shifted slightly relative to each other. This, to a good approximation fills the aperture A0 of the projection system.

Although this embodiment of the invention has been described in relation to a conventional disc shaped mode, it is noted that other illumination modes may be used, for example annular illumination modes, such that filling of the aperture will still occur. Preferably the illumination mode used for system qualification should correspond to the illumination that will be used for production purposes.

In another embodiment, the mask pattern includes at least one assist feature defined as a line-shaped segment located near a critical outer edge of a plurality of line-shaped segments. This can be achieved by using a target mask pattern of which pitch of features of the overlay structure resembles product feature pitch, but of which the image is projected in the image plane as a genuine metrology overlay target structure. The target mask pattern according to an embodiment of the invention, may be constructed of segmented elements, which have a sub-resolution size (i.e., they are not printable), but due to their pitch in a projection advantageously may form the image of the metrology overlay target.

In an embodiment, a mask pattern has a minimal pattern induced distortion.

In an embodiment, the mask pattern for the marker structure comprises isolated elements, the isolation causing the projected patterned beam to substantially fill the aperture of the projection system.

Furthermore, it is noted that principles of the invention as described in general relation to metrology overlay targets may be applied in relation to alignment markers as well.

An illumination system according to an embodiment of the present invention, provides an illumination for use during system qualification, which does not differ from the illumination normally used for production purposes. As a result, the envelope of illumination of an optically isolated pattern structure covers in good approximation the complete aperture of the projection system and reduces the effects of pattern-induced distortion during system qualification.

According to another embodiment of the invention, a marker structure for optical alignment or overlay has a minimal pattern induced distortion. In this embodiment, a marker structure may be generated by a mask pattern as described herein.

While specific embodiments have been described above, it will be appreciated that the invention may be practiced otherwise than as described. In addition, embodiments also include computer programs (e.g. one or more sets or sequences of instructions) to control a lithographic apparatus to perform a method as described herein, and storage media (e.g. disks, semiconductor memory) storing one or more such programs in machine-readable form. The description is not intended to limit the invention.

What is claimed is:

1. A method for determining a positional relationship between a first structure exposed in a first layer of material on a substrate using a lithographic apparatus and a second structure exposed in a second layer of material on the substrate different than the first layer using the lithographic apparatus, the method comprising:
   determining a position of a center of gravity of each of the first structure and the second structure; and
   calculating a difference of position between the centers of gravity of the first and the second structures,
   wherein each of the first and the second structures includes a plurality of segments arranged in a direction substantially perpendicular to a scanning direction of the lithographic apparatus, each of the first and the second structures includes at least one assist feature having a size less than a resolution of the lithographic apparatus, and
   wherein each said at least one assist feature is located at a corresponding critical part of the segment shape.

2. The method according to claim 1, wherein the at least one assist feature includes a block-shaped segment located near a corner of a rectangular segment.

3. The method according to claim 1, wherein the at least one assist feature includes a line-shaped segment located near an outer edge of a plurality of line-shaped segments.

* * * * *

UNITED STATES PATENT AND TRADEMARK OFFICE
CERTIFICATE OF CORRECTION

PATENT NO.        : 7,466,413 B2
APPLICATION NO.   : 10/887323
DATED             : December 16, 2008
INVENTOR(S)       : Jozef Maria Finders et al.

It is certified that error appears in the above-identified patent and that said Letters Patent is hereby corrected as shown below:

Title Page, Item (56) References Cited: insert the following references under Other Publications:

Search Report for European Application No. 04076827.7, dated February 3, 2005.

Korean Office Action issued for Korean Patent Application No. 10-2004-0053357 dated May 29, 2006.

Signed and Sealed this

Sixteenth Day of June, 2009

JOHN DOLL
*Acting Director of the United States Patent and Trademark Office*